United States Patent
Chang et al.

(10) Patent No.: US 11,462,471 B2
(45) Date of Patent: Oct. 4, 2022

(54) MIDDLE-OF-LINE INTERCONNECT STRUCTURE AND MANUFACTURING METHOD

(71) Applicant: Taiwan Semiconductor Manufacturing Co., Ltd., Hsin-Chu (TW)

(72) Inventors: Cheng-Wei Chang, Taipei (TW); Sung-Li Wang, Zhubei (TW); Yi-Ying Liu, Hsinchu (TW); Chia-Hung Chu, Taipei (TW); Fang-Wei Lee, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 56 days.

(21) Appl. No.: 16/844,133

(22) Filed: Apr. 9, 2020

(65) Prior Publication Data
US 2021/0098366 A1 Apr. 1, 2021

Related U.S. Application Data

(60) Provisional application No. 62/908,029, filed on Sep. 30, 2019.

(51) Int. Cl.
*H01L 23/522* (2006.01)
*H01L 23/528* (2006.01)
(Continued)

(52) U.S. Cl.
CPC .... *H01L 23/5226* (2013.01); *H01L 21/28568* (2013.01); *H01L 21/76802* (2013.01);
(Continued)

(58) Field of Classification Search
CPC ............ H01L 23/5226; H01L 23/528; H01L 23/53266; H01L 21/28568;
(Continued)

(56) References Cited

U.S. PATENT DOCUMENTS 5,637,533 A * 6/1997 Choi ................. H01L 21/76843
438/643
10,157,790 B1 * 12/2018 You ................... H01L 21/76849
(Continued)

OTHER PUBLICATIONS

CRCT:Centre for Research in Computational Thermochemistry. "Data From SGnobl Noble Metal Alloy Database Fact Stage." Published in 2010.

*Primary Examiner* — Thanh T Nguyen
(74) *Attorney, Agent, or Firm* — Eschweiler & Potashnik, LLC

(57) ABSTRACT

In some embodiments, the present disclosure relates to an integrated circuit device. A transistor structure includes a gate electrode separated from a substrate by a gate dielectric and a pair of source/drain regions disposed within the substrate on opposite sides of the gate electrode. A lower conductive plug is disposed through a lower inter-layer dielectric (ILD) layer and contacting a first source/drain region. A capping layer is disposed directly on the lower conductive plug. An upper inter-layer dielectric (ILD) layer is disposed over the capping layer and the lower ILD layer. An upper conductive plug is disposed through the upper ILD layer and directly on the capping layer.

20 Claims, 10 Drawing Sheets

(51) Int. Cl.
   *H01L 23/532*   (2006.01)
   *H01L 21/285*   (2006.01)
   *H01L 21/768*   (2006.01)

(52) U.S. Cl.
   CPC .. *H01L 21/76843* (2013.01); *H01L 21/76864* (2013.01); *H01L 21/76877* (2013.01); *H01L 23/528* (2013.01); *H01L 23/53266* (2013.01)

(58) Field of Classification Search
   CPC ......... H01L 21/76877; H01L 21/76864; H01L 21/76843; H01L 21/76802; H01L 23/485; H01L 21/76883; H01L 21/76849; H01L 23/53252; H01L 21/76867; H01L 21/76895; H01L 21/76897; H01L 21/76829; H01L 21/823475
   See application file for complete search history.

(56) References Cited

U.S. PATENT DOCUMENTS

| | | | |
|---|---|---|---|
| 10,731,250 B2* | 8/2020 | Kim | H01L 21/76843 |
| 2004/0192026 A1 | 9/2004 | Chen et al. | |
| 2007/0032015 A1 | 2/2007 | Itoh et al. | |
| 2008/0217775 A1* | 9/2008 | Pai | H01L 27/10888 |
| | | | 257/E23.141 |
| 2009/0309227 A1 | 12/2009 | King et al. | |
| 2012/0007240 A1 | 1/2012 | Jung et al. | |
| 2015/0155288 A1 | 6/2015 | Nakao | |
| 2019/0122922 A1 | 4/2019 | Joi et al. | |
| 2019/0164813 A1 | 5/2019 | Wang et al. | |
| 2019/0244896 A1* | 8/2019 | Lee | H01L 21/0228 |
| 2019/0259855 A1 | 8/2019 | Cheng et al. | |

* cited by examiner

MIDDLE-OF-LINE INTERCONNECT STRUCTURE AND MANUFACTURING METHOD

REFERENCE TO RELATED APPLICATION

This application claims the benefit of U.S. Provisional Application No. 62/908,029, filed on Sep. 30, 2019, the contents of which are hereby incorporated by reference in their entirety.

BACKGROUND

In the manufacturing of integrated circuits (ICs), devices are formed on a wafer and connected by conductive interconnect layers. These conductive interconnect layers can be formed during so-called middle-of-the-line (MOL) processes or back-end-of-line (BEOL) processes. MOL and BEOL processes are similar in that they both form openings in a dielectric layer (e.g. contact holes, trenches, or via holes in a dielectric layer), and then fill these openings with a conductive material. MOL differs from BEOL in that the MOL typically occurs earlier in the fabrication process, and may refer to the process of forming contacts to conductive regions such as source/drain drain regions in the substrate; whereas BEOL typically occurs later in the fabrication process, and may refer to the process of forming successive metallization layers and vias above the contacts formed by MOL.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
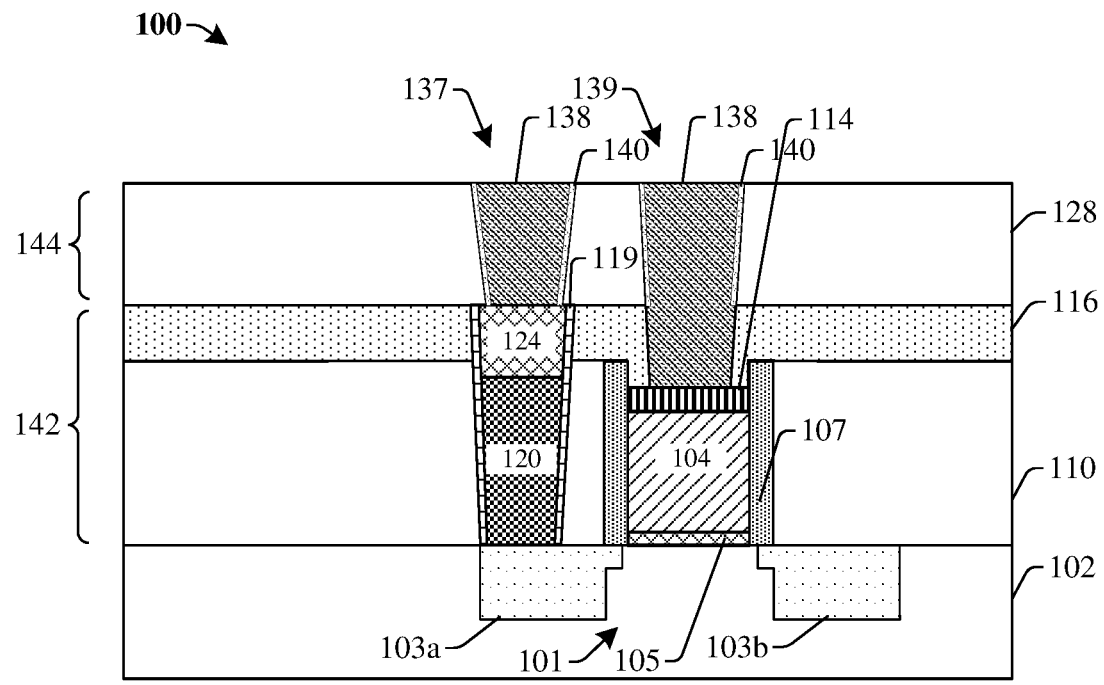
FIG. 1 illustrates a cross-sectional view of some embodiments of an integrated circuit having a ruthenium contact structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In a middle-of-the-line (MOL) interconnect structure, both contacts and interconnect vias and metal lines play a significant role in transistor and circuit performance. As scaling continues, contact and interconnect resistance is becoming the key limiting factor for device performance. Some solutions are beginning to emerge. For example, the MOL contacts may migrate from traditional tungsten materials to cobalt, which reduces the line resistance in chips. As an example, a first glue layer, e.g. made of titanium nitride (TiN) or tantalum nitride (TaN) and also functioned as a barrier liner, is firstly formed lining a lower plug opening. Then, a lower plug made of cobalt is formed to fill the remainder of the lower plug opening. Above the cobalt plug, a second glue layer (e.g. made of titanium, titanium nitride, or tantalum nitride) may be deposited lining an upper plug opening and reaching on a top surface of the lower plug. The upper plug opening is then filled with an upper plug made of tungsten. The glue layers were carried out for the growth of lower and upper plugs to increase the conformal adhesive between the sidewall interlayer dielectrics and the metal plugs and prevent metal diffusion to the sidewall interlayer dielectric. The tungsten plug may have a relative high resistance due to the phase transition introduced by the high temperature deposition.

Several ion implantation processes may be required for this cobalt/tungsten plug fabrication process. For example, a first germanium ion implantation process is applied between the filling of the lower cobalt plug and the upper tungsten plug, in order to prevent corrosion effect of the lower plug. It has been appreciated that removing the work piece from the vacuum chamber after forming the metal liner and the barrier liner (i.e., before the subsequent annealing process) has drawbacks. The ambient environment can cause oxidation of the metal liner and/or barrier liner, which can increase the resistance of the resultant interconnect structures. Although this oxidation can be removed by an oxidation reduction process, removal of the oxidation material can lead to the formation of voids. These voids can result in poor electrical connections and can decrease reliability. A second germanium ion implantation process needs to be applied after the filling of the upper tungsten plug to strength the sidewall interface of the tungsten and the sidewall interlayer dielectrics.

Accordingly, the present disclosure relates to an improved MOL interconnect structure and associated manufacturing methods to reduce contact resistance, reduce voids, improve reliability and simplify manufacturing processes. In some embodiments, a metal core material is filled in a contact or via opening of an interlayer dielectric without forming a glue layer or barrier layer first. The metal core material is sophisticatedly selected that a thin metal-dielectric intermixing barrier layer can be formed at the interface of the metal core and the interlayer dielectric by a proper annealing process. The metal-dielectric intermixing barrier layer acts as a glue and barrier layer to bond the metal core and prevent it from diffusing to the interlayer dielectric. In a more detailed embodiment, an integrated circuit comprises a contact structure having a lower conductive plug contacting a source/drain region and disposed through a lower inter-layer dielectric (ILD) layer. An upper conductive plug is disposed over the lower conductive plug and through an upper ILD layer. The upper conductive plug may be made of ruthenium (Ru). An intermixing barrier layer of ruthenium oxide may be disposed between the upper conductive plug and the upper ILD layer and acts as a homogeneous glue layer therebetween. The intermixing barrier layer may be formed by an annealing process following a filling process of the ruthenium conductive plug. Ruthenium is a better material to form contacts because of the less resistivity incensement of ruthenium film than tungsten and cobalt. In addition, ruthenium has higher melting point than cobalt and thus provides higher tolerance for subsequent manufacturing processes. As a result, contact resistance is reduced. Also, by forming the ruthenium oxide intermixing barrier layer by an annealing process, deposition processes for forming barrier layers are saved. The intermixing barrier layer ties the upper conductive plug to the upper ILD layer strongly to prevent the formation of voids. The ion implantation processes are also no longer needed because of the good adhesive performance of the intermixing barrier layer. Thus, the manufacturing is simplified and device liability is improved.

In some further embodiments, a capping layer is disposed between the lower conductive plug and the upper conductive plug. A lower barrier layer is disposed covering sidewalls of the capping layer and the lower conductive plug. The capping layer is made of a conductive material such as tungsten. By arranging the capping layer on the lower conductive plug, the upper conductive plug can be electrically coupled to the lower conductive plug, and the formation process of the upper conductive plug can be integrated together with forming a gate electrode plug coupling to a gate electrode.

FIG. 1 shows a cross-sectional view of an integrated circuit 100 in accordance with some embodiments. As shown in FIG. 1, a transistor structure 101 is disposed over a substrate 102. The transistor structure 101 can be a logic device that includes a gate electrode 104 separated from the substrate 102 by a gate dielectric layer 105. A pair of source/drain regions 103a, 103b is disposed within the substrate 102 on opposite sides of the gate electrode 104. In some embodiments, the transistor structure 101 can be a single-gate planar device as well as on a multi-gate device, such as the FinFET device. The transistor structure 101 can also be other devices such as gate-all-around (GAA) devices, Omega-gate devices, or Pi-gate devices, as well as strained-semiconductor devices, silicon-on-insulator (SOI) devices, partially-depleted SOI (PD-SOI) devices, fully-depleted SOI (FD-SOI) devices, or other applicable devices as known in the art.

Contacts are respectively coupled to the gate electrode 104, the source/drain regions 103a, 103b, body contact regions (not shown), or other active regions of the transistor structure 101. In some embodiments, a contact may comprise a lower contact structure 142 surrounded by a lower inter-layer dielectric (ILD) layer 110 and electrically connected to an upper contact structure 144 surrounded by an upper inter-layer dielectric (ILD) layer 128 and disposed over the lower ILD layer 110. In some embodiments, the lower contact structure 142 comprises a lower conductive plug 120 disposed through the lower ILD layer 110 and contacting a first source/drain region 103a. In some embodiments, the lower conductive plug 120 comprises or is made of cobalt. In some embodiments, a capping layer 124 is disposed directly on the lower conductive plug 120. In some embodiments, the capping layer 124 comprises or is made of tungsten. In some embodiments, a lower barrier layer 119 is disposed along sidewalls of the lower conductive plug 120. The lower barrier layer 119 may cover sidewalls of the capping layer 124 and the lower conductive plug 120. In some embodiments, the capping layer 124 may have a thickness in a range of 8 nm to 15 nm.

In some embodiments, the upper contact structure 144 comprises an upper conductive plug 137 disposed through the upper ILD layer 128 and directly reaching on the capping layer 124. In some embodiments, the capping layer 124 isolates the upper conductive plug 137 and the lower conductive plug 120 and may have a top surface directly contacting the upper conductive plug 137 and a bottom surface directly contacting the lower conductive plug 120. In some embodiments, the upper conductive plug 137 comprises a metal core 138 and an intermixing barrier layer 140 lining an interface of the metal core 138 and the upper ILD layer 128. The intermixing barrier layer 140 may be a material mixed of materials of the metal core 138 and the upper ILD layer 128. In some embodiments, the metal core 138 comprises or is made of ruthenium. In some embodiments, the intermixing barrier layer 140 contains ruthenium and oxygen. In some embodiments, the intermixing barrier layer 140 comprises or is made of ruthenium oxide. In some embodiments, the intermixing barrier layer 140 contains ruthenium, silicon, and oxygen. In some embodiments, the intermixing barrier layer 140 contains ruthenium, aluminum, and oxygen. Ruthenium is a better material to form contacts because of the less resistivity incensement of ruthenium film than tungsten and cobalt. Ruthenium metal core may have only hcp (hexagonal close packing) lattice structure comparing to tungsten may have a phase transition to β-W when deposited at a temperature range of 100° C. to 200° C. A bulk resistance of ruthenium plug can be 40% less than that of a tungsten plug. In addition, ruthenium has higher melting point than cobalt and thus provides higher tolerance for subsequent manufacturing processes. As a result, contact resistance is reduced. The intermixing barrier layer 140 acts as a glue and barrier layer to bond the metal core 138 to prevent the formation of voids and to prevent the metal core 138 from diffusing to the upper ILD layer 128. Thereby, the device liability is improved.

In some embodiments, the intermixing barrier layer 140 has a thickness in a range of from about 10 nm to about 15 nm. In some embodiments, the upper contact structure 144 further comprises a gate electrode plug 139 disposed next to the upper conductive plug 137 and through the upper ILD layer 128. The gate electrode plug 139 may be electrically coupled to the gate electrode 104 through a gate barrier layer 114. The gate electrode 104 may comprise a stack of metal layers including work function metals disposed on a core gate metal. The gate barrier layer 114 may comprise or be made of fluorine-free tungsten (FFW). In some embodiments, the gate electrode plug 139 comprises or is made of the same material of the upper conductive plug 137, i.e., the metal core 138 and the intermixing barrier layer 140 disposed along the sidewall of the metal core 138.

In some embodiments, a first contact etch stop layer (CESL) 116 is disposed between the upper ILD layer 128 and the lower ILD layer 110. The first contact etch stop layer 116 may have a top surface coplanar with that of the capping layer 124. As an example, the first contact etch stop layer 116 may comprise or be made of silicon nitride. In some embodiments, the intermixing barrier layer 140 is disposed at an interface of the metal core 138 and the upper ILD layer 128, but absent from an interface of the metal core 138 and the first contact etch stop layer 116 and an interface of the metal core 138 and the gate barrier layer 114.

Figure 2:
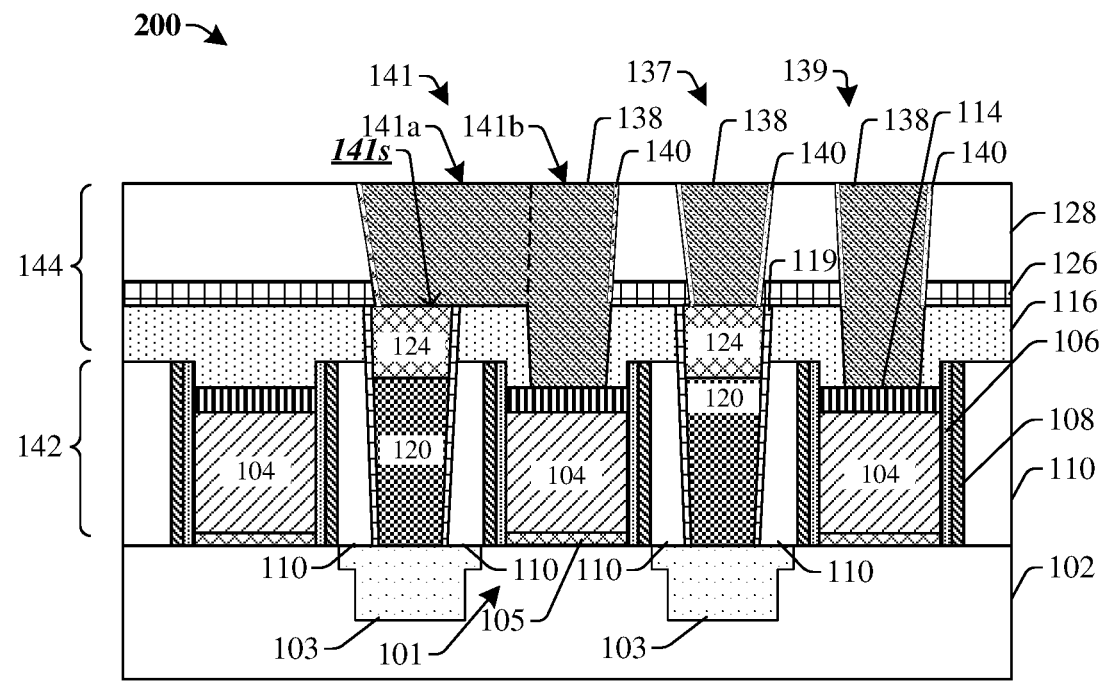
FIG. 2 illustrates a cross-sectional view of some additional embodiments of an integrated circuit having a ruthenium contact structure.

FIG. 2 shows a cross-sectional view of an integrated circuit 200 in accordance with some additional embodiments. Besides the upper conductive plug 137 and the gate electrode plug 139 described above in FIG. 1, the upper contact structure 144 may also comprise a power rail (VDR) conductive plug 141 comprising the metal core 138 and the intermixing barrier layer 140 lining the interface of the metal core 138 and the upper ILD layer 128. The VDR conductive plug 141 comprises a first portion 141a electrically coupled to a source/drain region 103 through the lower conductive plug 120 and a second portion 141b disposed through the first contact etch stop layer 116 and electrically coupled to the gate electrode 104. The first portion 141a has a bottom surface 141s disposed on the capping layer 124. In some embodiments, the VDR conductive plug 141 comprises or is made of the same material of the upper conductive plug 137 and the gate electrode plug 139, i.e., the metal core 138 and the intermixing barrier layer 140 disposed along the sidewall of the metal core 138. The intermixing barrier layer 140 of the VDR conductive plug 141 may be absent from the bottom surface 141s and an interface of the metal core 138 and the first contact etch stop layer 116. In some embodiments, the VDR conductive plug 141 may have a depth in a range of 18 nm to 33 nm and a width in a range of 20 nm to 35 nm, the upper conductive plug 137 may have a depth in a range of 18 nm to 22 nm and a width in a range of 9 nm to 17 nm, and the gate electrode plug 139 may have a depth in a range of 28 nm to 35 nm and a width in a range of 7 nm to 15 nm.

In some embodiments, a second contact etch stop layer 126 is formed over the first contact etch stop layer 116, and the upper ILD layer 128 is formed over the second contact etch stop layer 126. As an example, the second contact etch stop layer 126 may comprise or be made of aluminum oxide. The second contact etch stop layer 126 may also comprise or be made of nitride dielectric material such as silicon nitride. In some embodiments, the upper ILD layer 128 may include or be made of materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. Thus, in some cases, the upper ILD layer 128 may be substantially the same as the lower ILD layer 110. In some embodiments, the intermixing barrier layer 140 may comprise an upper portion and a lower portion. The upper portion covers an interface of the metal core 138 and the upper ILD layer 128. The lower portion covers an interface of the metal core 138 and the second contact etch stop layer 126. In some embodiments, the upper ILD layer 128 and the second contact etch stop layer 126 may comprise or be made of materials with different ratios of oxygen atoms, such that ratios of oxygen atoms in the lower portion and the upper portion of the intermixing barrier layer 140 may differ. In some alternative embodiments, the intermixing barrier layer 140 may be disposed at an interface of the metal core 138 and the upper ILD layer 128, but be absent from an interface of the metal core 138 and the second contact etch stop layer 126. In this instance, the second contact etch stop layer 126 may comprise non-oxide dielectric materials such as silicon nitride. In some embodiments, the intermixing barrier layer 140 may not cover an interface of the metal core 138 and the first contact etch stop layer 116, and the metal core 138 directly contacts the first contact etch stop layer 116. In this instance, the first contact etch stop layer 116 may comprise silicon nitride. In some examples, the second contact etch stop layer 126 has a thickness of about 5-20 nm, and the upper ILD layer 128 has a thickness of about 5-40 nm.

Figure 3:
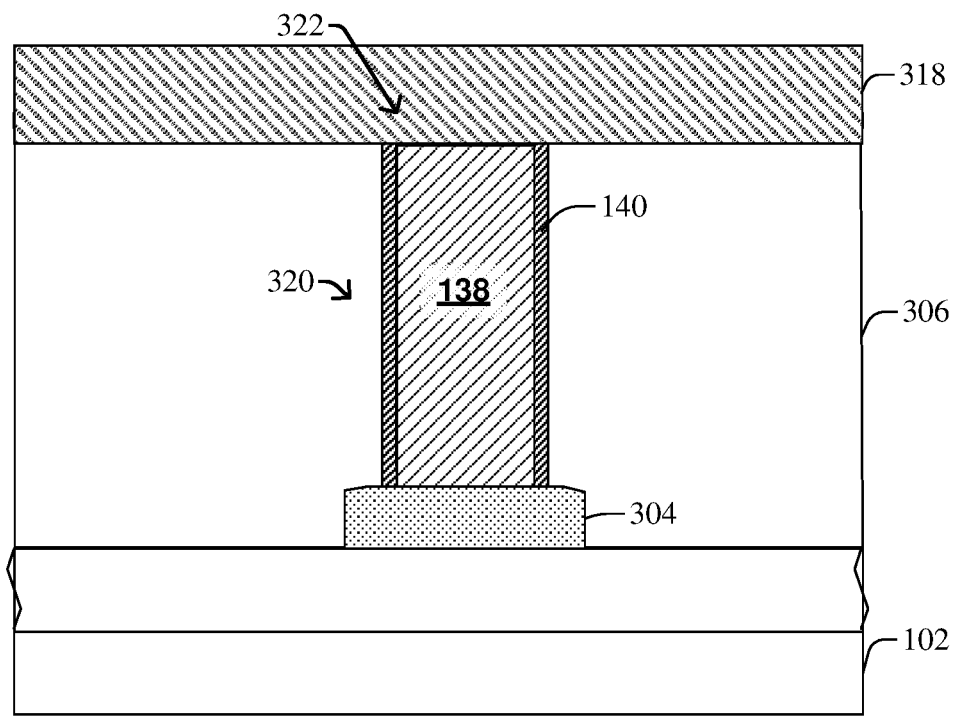
FIG. 3 illustrates some embodiments of an integrated circuit having an interconnect structure with an intermixing barrier layer.

FIG. 3 illustrates some embodiments of an integrated circuit 300 having an interconnect structure with a metal core separated from an ILD layer by an intermixing barrier layer. Though the intermixing barrier layer structure is described above associated with the upper contact structure 144 as shown in FIG. 1 and FIG. 2, it is appreciated that similar structures and manufacturing processes can also be used to form other conductive vias or even metal lines for MOL interconnect structure or even other interconnect structures in order to achieve improved connecting performance. In some embodiments, the integrated circuit 300 comprises a dielectric layer 306 disposed over the substrate 102. A conductive interconnect structure 320 is disposed within an opening 322 vertically extending through the dielectric layer 306. The conductive interconnect structure 320 can be a contact plug, a via, or a metal line connecting two conductive features 304, 318. In some embodiments, the conductive features 304 and 318 can respectively be metal lines or metal vias of an interconnect structure. In some alternative embodiments, the conductive feature 304 is a middle-of-the-line (MOL) structure, an active region of a semiconductor device comprising a doped semiconductor structure, such as a source/drain region or polysilicon gate or metal gate of a transistor.

The conductive interconnect structure 320 comprises a metal core 138 and an intermixing barrier layer 140 lining an interface of the metal core 138 and the dielectric layer 306. Similar as illustrated above, the intermixing barrier layer 140 may be a material mixed of materials of the metal core 138 and the dielectric layer 306. The metal core 138 may be a continuous conductive body of uniform material with a thickness of from about 200 nm to about 600 nm. The intermixing barrier layer 140 may be formed by performing an annealing process to mix and form a very thin liner between the metal core 138 and the dielectric layer 306. The intermixing barrier layer has a thickness in a range of from about 10 nm to about 15 nm. In some embodiments, the metal core 138 is ruthenium, and the intermixing barrier layer 140 comprises or is made of a compound of oxygen atoms and ruthenium atoms, providing adhesion and isolation between the conductive interconnect structure 320 and the dielectric layer 306.

FIGS. 4-17 illustrate cross-sectional views 400-1700 of some embodiments of a method of forming an integrated circuit having a ruthenium contact structure. Although FIGS. 4-17 are described in relation to a method, it will be appreciated that the structures disclosed in FIGS. 4-17 are not limited to such a method, but instead may stand alone as structures independent of the method.

Figure 4:
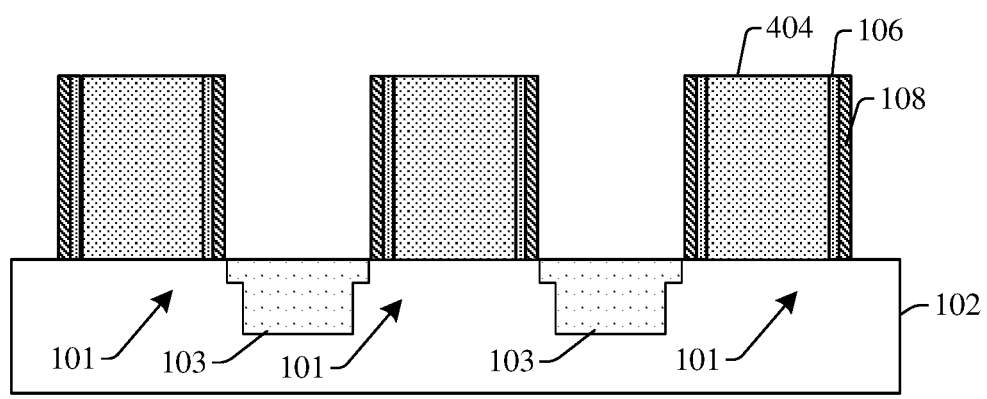
FIGS. 4-17 illustrate cross-sectional views of some embodiments of a method of forming an integrated circuit having a ruthenium contact structure.
Figure 5:
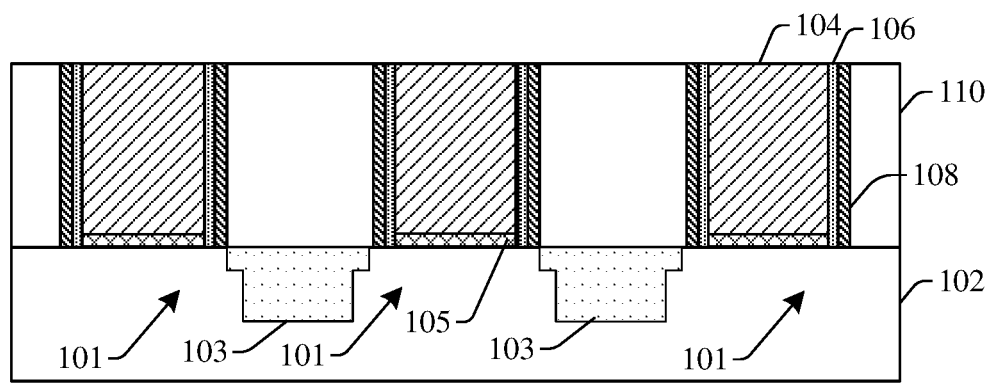

As shown in FIG. 4 and FIG. 5, a transistor structures 101 is formed over a substrate 102 and surrounded by a lower ILD layer 110. In some embodiments, the transistor structure 101 has a gate dielectric layer 105 over the substrate 102, a gate electrode 104 over the gate dielectric layer 105, and a pair of source/drain regions 103 within the substrate 102 disposed on opposite sides of the gate electrode 104 (see FIG. 5). The gate electrode 104 may be a polysilicon gate or a metal gate. The gate dielectric layer 105 may comprise or be made of a silicon dioxide layer or a high-k dielectric material such as hafnium dioxide. The gate electrode 104 and the gate dielectric layer 105 may be formed by a replacement gate process where a dummy gate 404 is firstly formed and patterned over the substrate 102. Sidewall spacers 106, 108 may be formed alongside the dummy gate 404 lining or covering sidewalls of the dummy gate 404 (see FIG. 4). Then, source/drain regions 103 may be formed on opposite sides of the sidewall spacers 106, 108 within the substrate 102. In some cases, each of the sidewall spacer 106, 108 include materials having different dielectric constant values (e.g., k values). In various embodiments, the sidewall spacer 106, 108 include silicon oxide, silicon nitride, silicon carbide, aluminum oxide, aluminum nitride or the combinations thereof, or other suitable dielectric materials. In some embodiments, the sidewall spacer 106, 108 include multiple layers, such as main spacer walls, liner layers, and the like. As an example, the sidewall spacer 106, 108 may be formed by depositing a dielectric material over the dummy gate 404 and vertically etching back the dielectric material to have a top surface substantially coplanar with that of the dummy gate 404.

As shown in FIG. 5, a dielectric layer is deposited over the transistor structures 101 followed by a planarization process to form the lower ILD layer 110. As an example, the dielectric layer may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The lower ILD layer 110 may be deposited by a subatmospheric CVD (SACVD) process, a flowable CVD process, or other suitable deposition technique. The dielectric layer may be planarized by a chemical mechanical planarization (CMP) process to have a top surface substantially coplanar with that of the sidewall spacer 106, 108. As an example, the lower ILD layer 110 has a thickness of about 5-40 nm. For the replacement gate process, the dummy gate 404 in FIG. 4 is then removed and replaced by the gate electrode 104. The gate dielectric layer 105 may also be formed after removing the dummy gate 404. To form the gate electrode 104, stacks of metal materials may be filled in gate openings followed by a planarization process to remove excessive portions above the lower ILD layer 110. Varied for different devices, the stacks of metal materials may comprise or be made of titanium nitride, tantalum nitride, titanium aluminum, and aluminum, etc. Other materials can also be used for the gate electrode 104.

Figure 6:
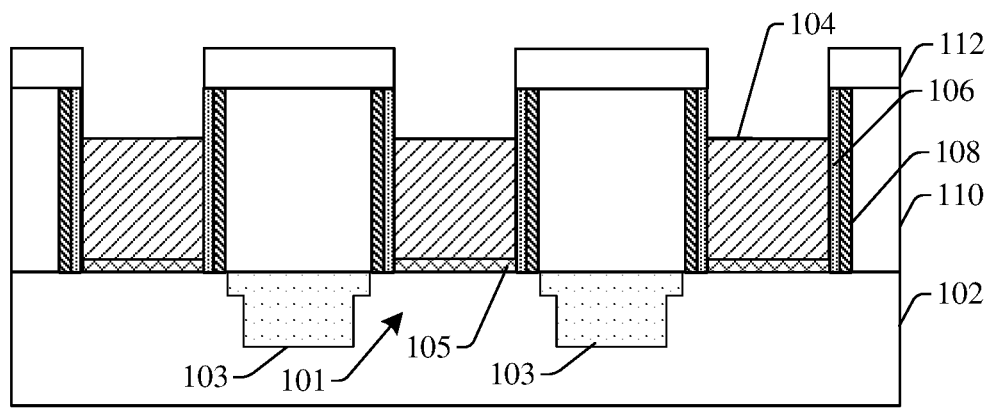

As shown in FIG. 6, the gate electrode 104 is recessed. In some embodiments, a patterning process is firstly performed to form a masking layer 112 over the lower ILD layer 110, leaving the gate electrode exposed. Then, an etching process is performed to the gate electrode 104 to lower a top surface of the gate electrode to a position lower than a top surface of the sidewall spacers 106, 108. The etching process controls a thickness of the gate electrode and thus tunes an effective work function of the gate electrode 104 to a desired value.

Figure 7:
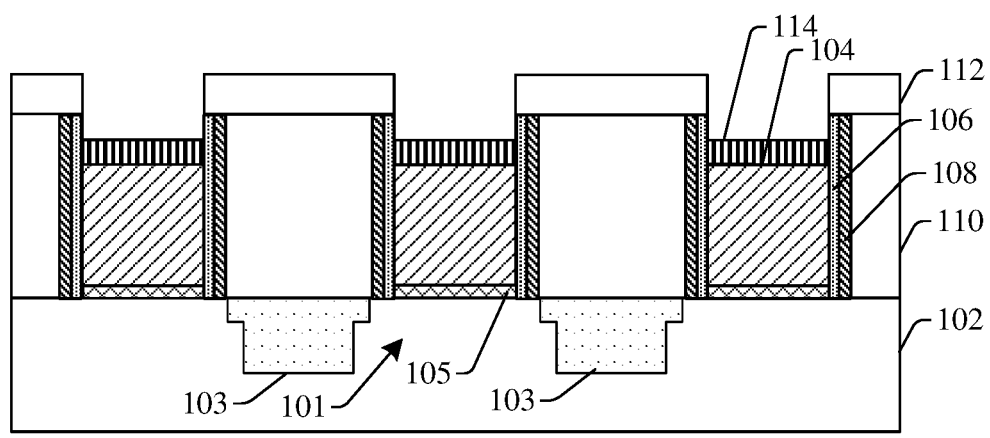

As shown in FIG. 7, a gate barrier layer 114 is formed on the recessed upper surface of the gate electrode 104 and may function as a diffusion barrier. In some embodiments, the gate barrier layer 114 comprises or is made of fluorine-free tungsten (FFW). The gate barrier layer 114 prevent material intermixing of the gate electrode 104 and a gate electrode plug to be formed such that a threshold voltage degradation can be reduced or prevented. In some embodiments, the gate barrier layer 114 may be deposited using a metal organic tungsten source not containing fluorine (F). Since fluorine (F) is not included in the layer, a surface of the underlying gate electrode 104 is not deteriorated. The gate barrier layer 114 may be etched back to have the top surface lowered to a position lower than a top surface of the sidewall spacers 106, 108. In some embodiments, the masking layer 112 comprises or is made of photoresist material. In some alternative embodiments, the masking layer 112 may comprise or is made of hard masking material such as silicon oxide, silicon nitride, or other applicable metal or dielectric material.

Figure 8:
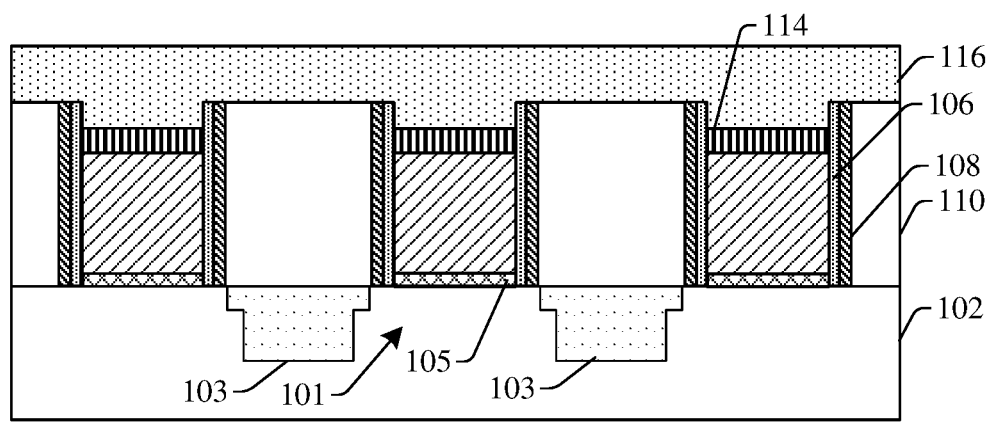

As shown in FIG. 8, a first contact etch stop layer 116 is formed over the gate barrier layer 114 filling a remaining upper portion of the sidewall spacer 106. The first contact etch stop layer 116 may comprise or be made of silicon nitride and may be deposited and then planarized to cover top surfaces of the lower ILD layer 110 and the sidewall spacers 106, 108.

Figure 9:
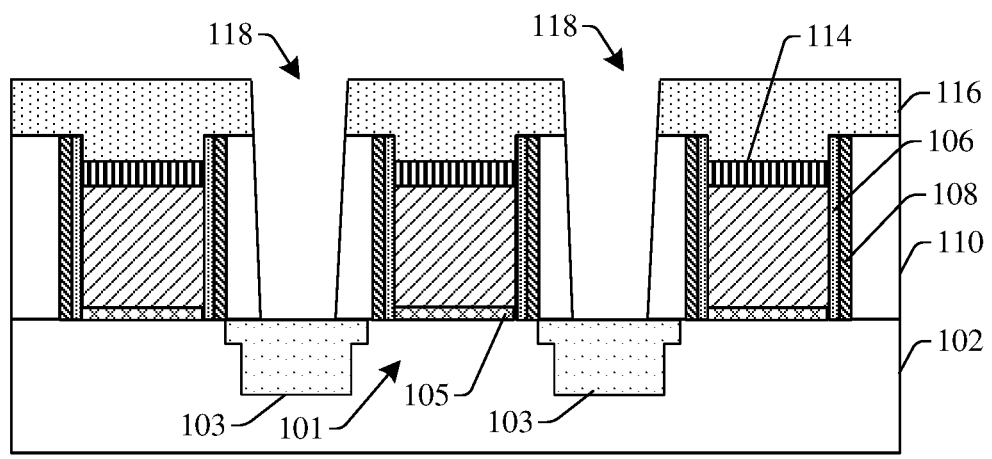

As shown in FIG. 9, a first pattern, that includes an opening 118, is formed through the first contact etch stop layer 116 and the lower ILD layer 110. In some cases, the opening 118 provides access to source, drain, or body contact regions. As an example, the opening 118 may be formed by a suitable combination of lithographic patterning and etching (e.g., wet or dry etching) processes. A metalization process may be performed to form a semiconductor-metal compound (such as silicide, germanides, germanosilicide) layer on exposed portions of the substrate 102 (e.g., exposed by the opening 118), thus providing a low resistance contact.

Figure 10:
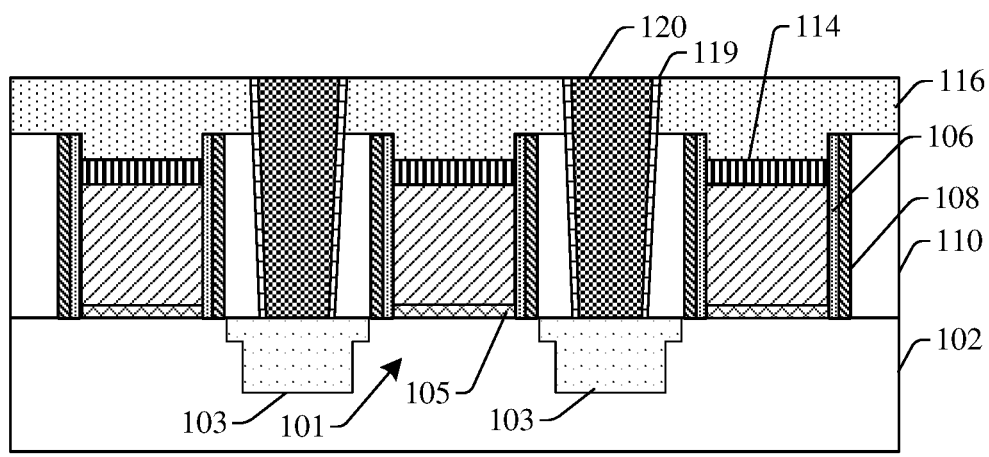

As shown in FIG. 10, in some examples, a lower glue or barrier layer 119 may be formed within the opening 118. In some cases, the lower glue or barrier layer 119 may include Ti, TiN, Ta, TaN, W, or other appropriate material. Then, a lower conductive plug 120 may be formed on the lower glue or barrier layer 119 within the opening 118. In some examples, the lower conductive plug 120 may include cobalt, or other appropriate material such as W, Cu, Ru, Al, Rh, Mo, Ta, Ti. After the deposition of the lower conductive plug 120, a chemical mechanical planarization (CMP) process may be performed to remove excess material of the lower glue or barrier layer 119 and the lower conductive plug 120 and planarize the top surface of the workpiece. In some embodiments, an annealing process may be performed after filling the lower barrier layer 119 and the lower conductive plug 120 to form a semiconductor-metal compound film at an interface of the lower barrier layer 119 and the exposed portion of the upper surface of the source/drain region 103.

Figure 11:
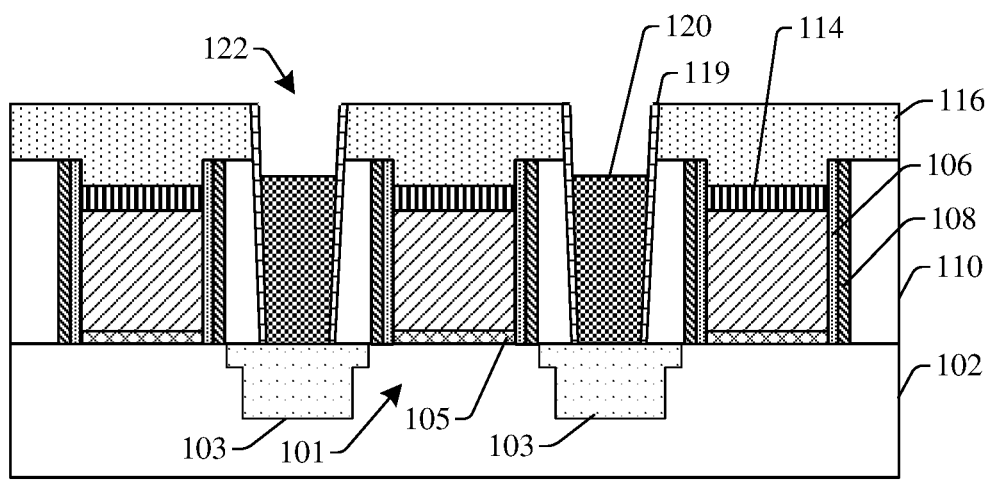

As shown in FIG. 11, the lower conductive plug 120 is recessed and thus an opening 122 is formed within an upper portion of the lower barrier layer 119. An etching process is performed to the lower conductive plug 120 to lower a top surface of the lower conductive plug 120 to a position lower than a top surface of the barrier layer 119.

Figure 12:
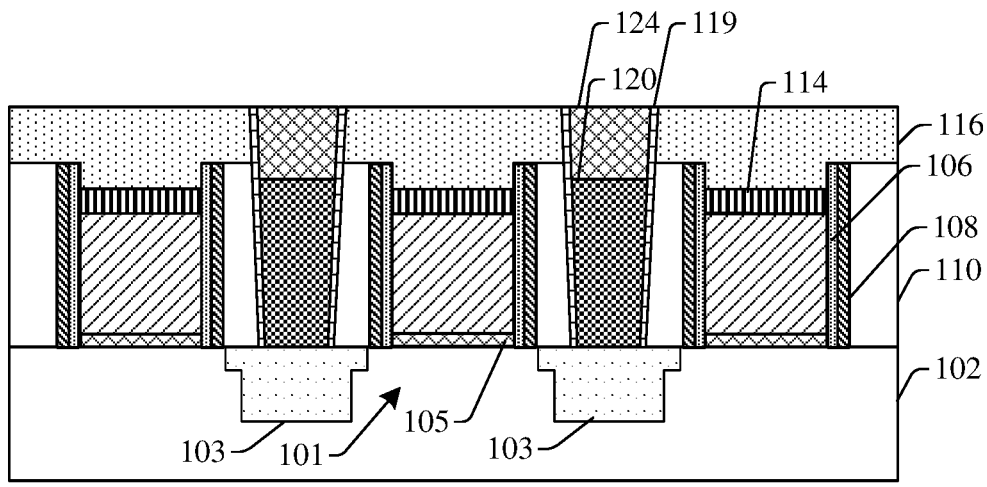

As shown in FIG. 12, a capping layer 124 is formed to fill the opening 122 within the upper portion of the lower barrier layer 119. In some embodiments, the capping layer 124 may be formed by depositing selective tungsten followed by a CMP process. The capping layer 124 may have a top surface substantially coplanar with that of the first contact etch stop layer 116 and/or the lower barrier layer 119. The lower barrier layer 119 may cover the whole surfaces of the lower conductive plug 120 and the capping layer 124. The capping layer 124 provides a protection and isolation to the lower conductive plug 120.

Figure 13:
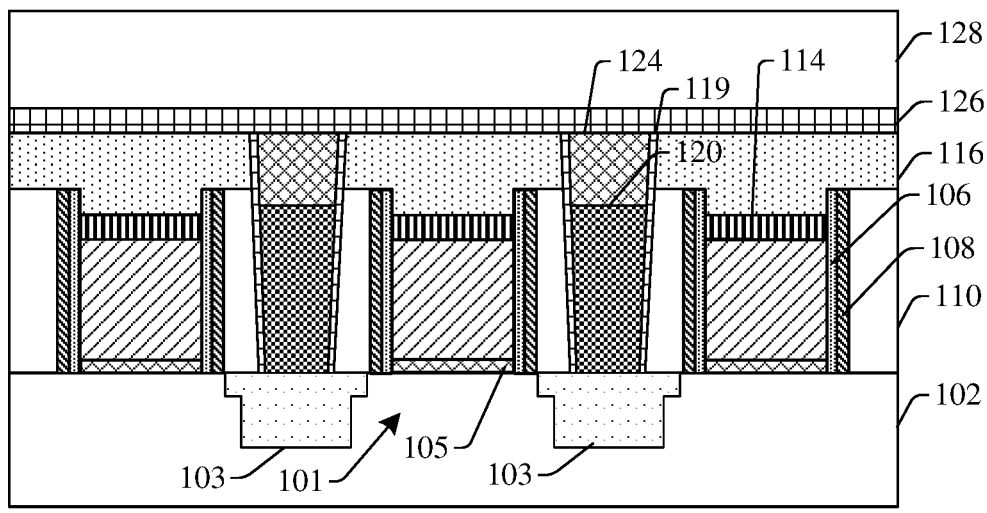

As shown in FIG. 13, a second contact etch stop layer 126 is formed over the first contact etch stop layer 116, and an upper ILD layer 128 is formed over the second contact etch stop layer 126. As an example, the second contact etch stop layer 126 may comprise or be made of aluminum oxide. The second contact etch stop layer 126 may also comprise or be made of silicon nitride (SiN) or Zirconia ($ZrO_2$). Other applicable dielectric materials may also be used for the second contact etch stop layer 126. In some embodiments, the upper ILD layer 128 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. Thus, in some cases, the upper ILD layer 128 may be substantially the same as the lower ILD layer 110. In various embodiments, the second contact etch stop layer 126 and the upper ILD layer 128 may be deposited by a subatmospheric CVD (SACVD) process, a flowable CVD process, an ALD process, a PVD process, or other suitable deposition technique. In some examples, the second contact etch stop layer 126 has a thickness of about 5-20 nm, and the upper ILD layer 128 has a thickness of about 5-40 nm.

Figure 14:
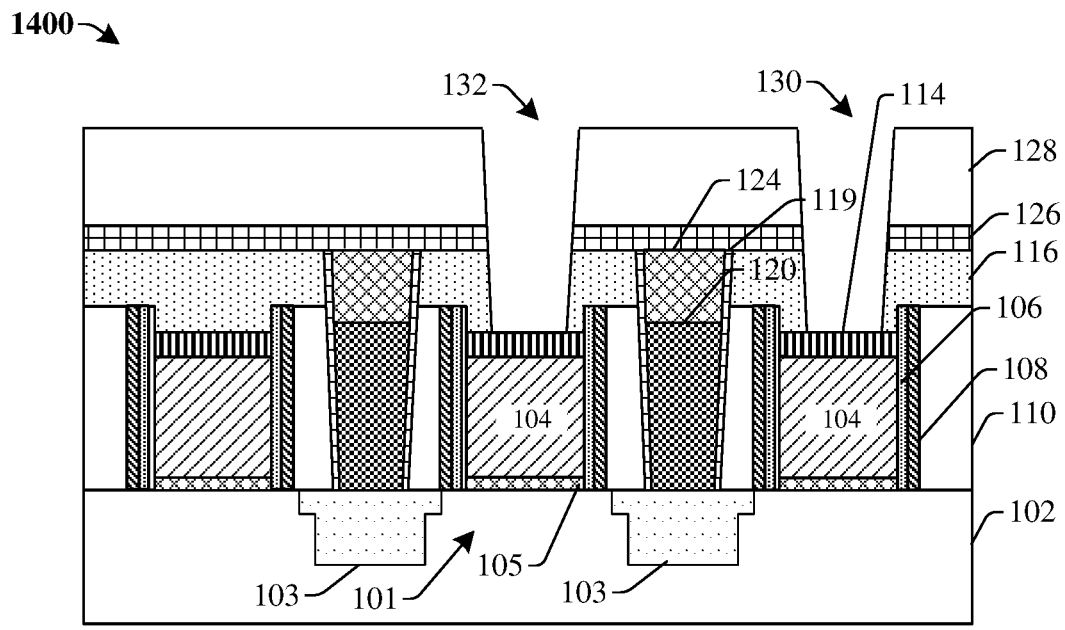
Figure 15:
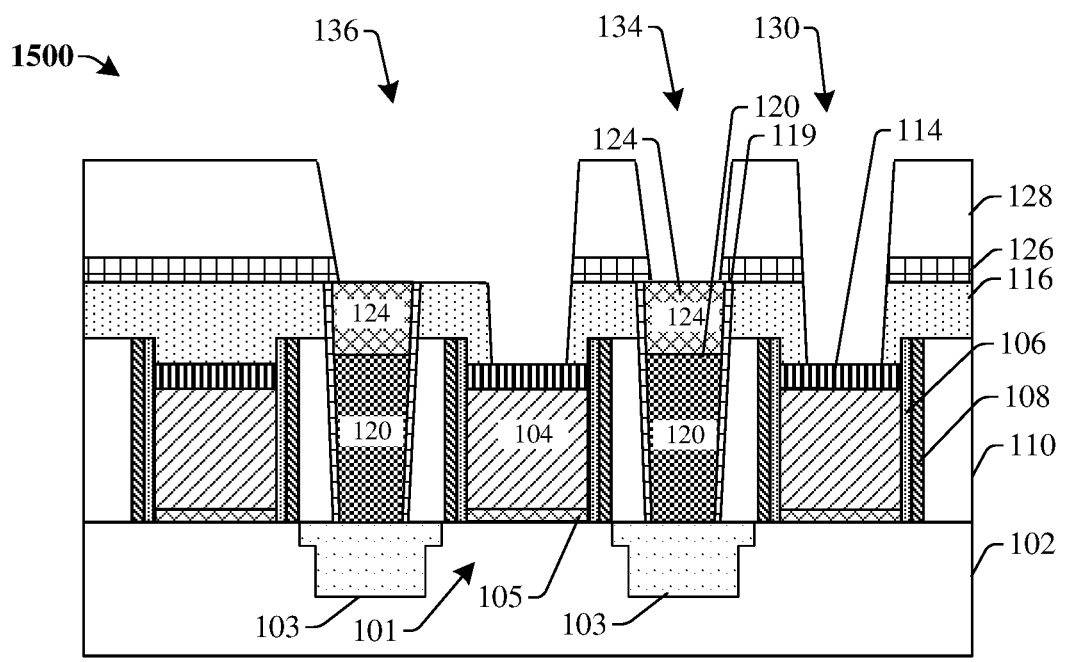
Figure 16:
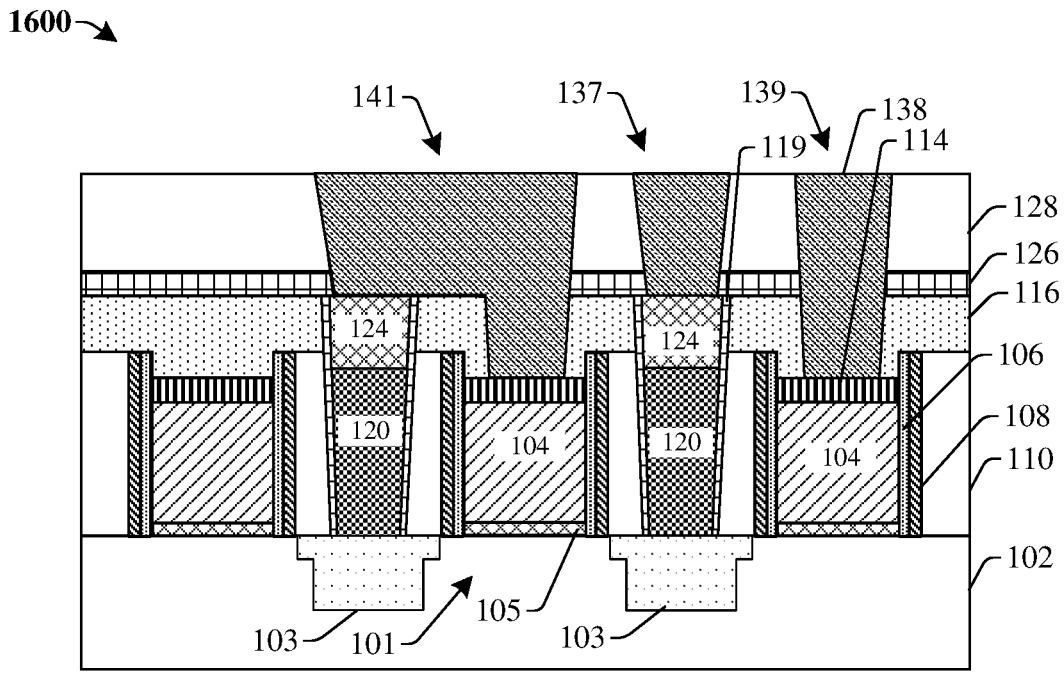

As shown in FIGS. 14-16, a plurality of openings 130, 132, 134, 136 is formed to reach on the gate barrier layer 114 or the capping layer 124 and then filled with a core metal material. In some embodiments, the core metal material is ruthenium. The plurality of openings 130, 132, 134, 136 can be formed one by one in any order or in some combination manner, but the plurality of openings 130, 132, 134, 136 may be all formed prior to filling the core metal material concurrently. The openings 130, 132, 134, 136 may respectively be formed by a multiple-step etching process separately to improve etch selectivity and provide over-etch control. For example, referring to FIG. 15, the opening 134 may be formed by performing a first etch having a high etching rate to the upper ILD layer 128 and stopping on the second contact etch stop layer 126. Then, a second etch is performed to etch the second contact etch stop layer 126 slowly and thus expose the capping layer 124 without too much over etching. Similarly, referring to FIG. 14, the opening 130 may be formed by performing a first etch having a high etching rate to the upper ILD layer 128 and stopping on the second contact etch stop layer 126. Then, a second etch is performed to etch the second contact etch stop layer 126 and the first contact etch stop layer 116 slowly and thus expose the gate barrier layer 114 without too much over etching. Alternatively, the opening 130 may be formed by performing a first etch having a high etching rate to the upper ILD layer 128 and the second contact etch stop layer 126 and stopping on the first contact etch stop layer 116. Then, a second etch is performed to etch the first contact etch stop layer 116 slowly and thus expose the gate barrier layer 114 without too much over etching. As an example, in FIG. 14, a second pattern, including an opening 130, is formed through the the upper ILD layer 128, the second contact etch stop layer 126, and the first contact etch stop layer 116. In some embodiments, the patterning process (e.g., for the formation of the plurality of openings) may include a multiple-step etching process to etch the upper ILD layer 128, the second contact etch stop layer 126, and the first contact etch stop layer 116 separately to improve etch selectivity and provide over-etch control. The opening 130 may also be formed by a suitable combination of lithographic patterning and etching (e.g., wet or dry etching) processes. In some cases, the opening 130 provides access to the gate electrode 104 through the gate barrier layer 114.

In FIG. 15, a third pattern, including a first opening 134 and a second opening 136, is formed through the upper ILD layer 128 and the second contact etch stop layer 126. In some embodiments, the patterning process (e.g., for the formation of the plurality of openings) may include a multiple-step etching process to etch the upper ILD layer 128 and the second contact etch stop layer 126 separately to improve etch selectivity and provide over-etch control. The openings 134, 136 may also be formed by a suitable combination of lithographic patterning and etching (e.g., wet or dry etching) processes. In some embodiments, an additional opening 132 may be formed in FIG. 14 and may be merged with the opening formed in FIG. 15 to form the opening 136.

As shown in FIG. 16, one or more metal layers are deposited to form metal cores 138 in the openings 130, 134, 136. In some cases, the VDR conductive plug 141 provides for a direct contact between the gate electrode 104 and an adjacent source, drain, and/or body region. The upper conductive plug 137 provides an access to the source/drain regions within the substrate 102 through the lower conductive plug 120, and the gate electrode plug 139 provides access to the gate electrode 104. As discussed above, the capping layer 124 isolates and protects the lower conductive plug 120. The gate barrier layer 114 isolates and protects the gate electrode 104. By arranging the the first contact etch stop layer 116, the second contact etch stop layer 126, the capping layer 124 on the lower conductive plug 120, and the gate barrier layer 114 on the gate electrode 104 as disclosed, the formation process of the upper conductive plug 137 can be integrated together with forming the gate electrode plug 139 and the VDR conductive plug 141. In some embodiments, the metal core 138 is formed by a chemical vapor deposition (CVD) process of ruthenium at a temperature range of 120° C. to 220° C. The ruthenium precursor may be in solid state. The ingredient of ruthenium precursor is comprised or is made of Ru, C, and O. The precursor may vaporize at a temperature range of 120° C. to 260° C. Ruthenium may be deposited on $SiO_2$, AlOx, W, SiN, or Co substances.

Figure 17:
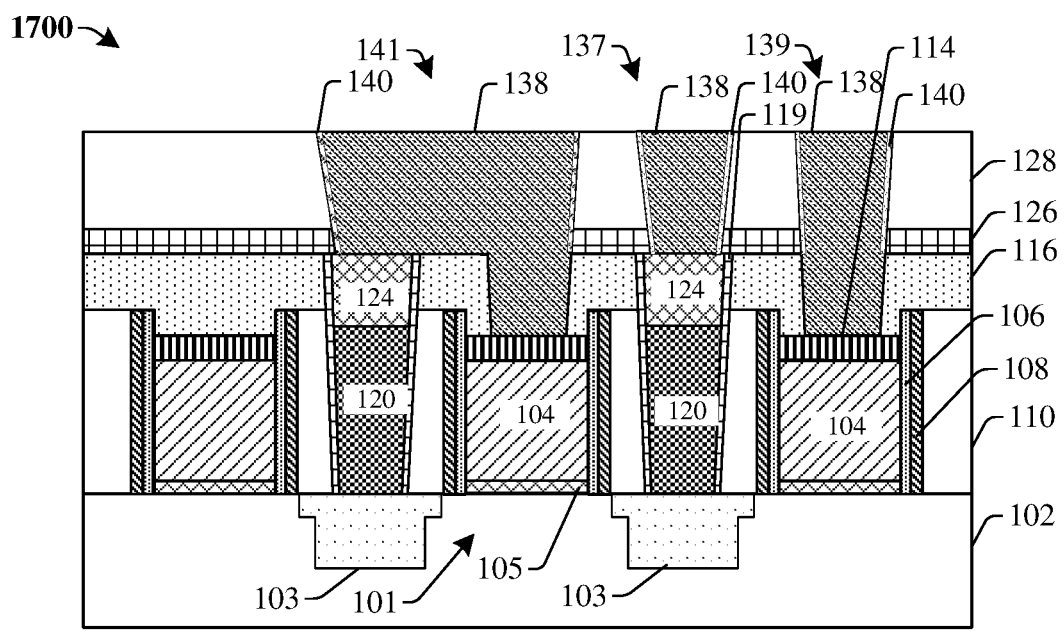

As shown in FIG. 17, an annealing process is performed such that a metal-dielectric intermixing barrier layer 140 is formed at an interface of the metal core 138 and the upper ILD layer 128. The intermixing barrier layer 140 may be formed at interfaces where the metal cores 138 contact dielectric materials having certain atoms. For example, ruthenium and oxygen atoms can form a self-limiting intermixing layer. The metal core 138 made of ruthenium forms the intermixing barrier layer 140 with dielectric materials containing oxygen atoms. As such, the intermixing barrier layer 140 may comprise an upper portion and a lower portion. The upper portion covers an interface of the metal core 138 and the upper ILD layer 128. The lower portion covers an interface of the metal core 138 and the second contact etch stop layer 126. In some embodiments, the upper ILD layer 128 and the second contact etch stop layer 126 may comprise or be made of materials with different ratios of oxygen atoms, such that ratios of oxygen atoms in the lower portion and the upper portion of the intermixing barrier layer 140 may differ. In some embodiments, the intermixing barrier layer 140 may not cover an interface of the metal core 138 and the first contact etch stop layer 116. Thus, the metal core 138 may directly contact the first contact etch stop layer 116. The metal-dielectric intermixing barrier layer 140 acts as a barrier and adhesive layer between the metal material of the metal cores 138 and the dielectric material of the upper ILD layer 128. Growth and reflow of the metal core 138 can be tuned by tailoring the working temperature. The needed annealing conditions depend on materials and device structure. The annealing process for a ruthenium metal core and oxide dielectric material should be performed at a temperature greater than 450° C. For example, an annealing at 530° C. for three hours can form a ruthenium-oxide intermixing barrier layer with a thickness in a range of from 14 Å to 34 Å. In some embodiments, the annealing process is performed at a temperature range of 490° C. to 550° C. The intermixing barrier layer 140 may have a thickness in a range of from 10 nm to 15 nm.

Figure 18:
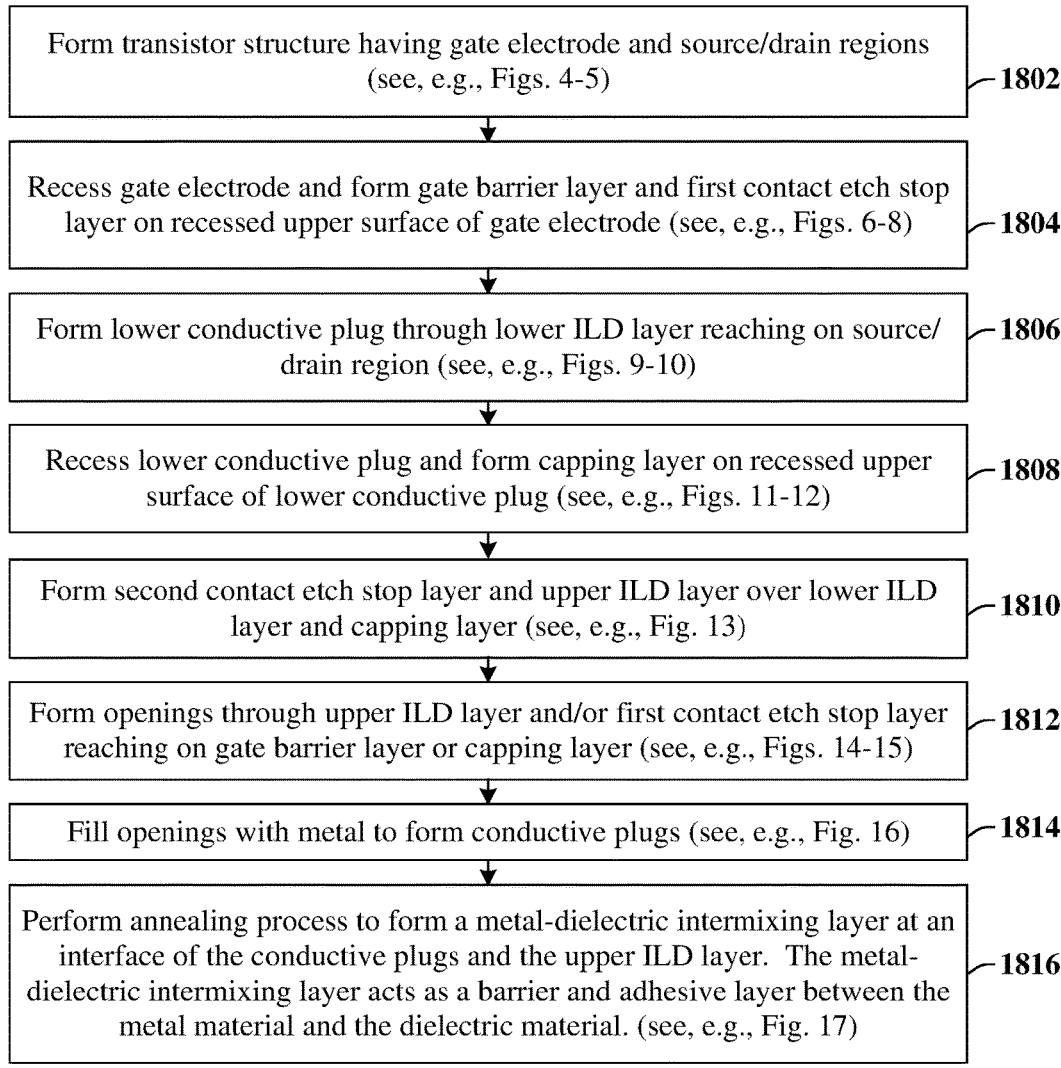
FIG. 18 illustrates a flow diagram of some embodiments of a method of forming an integrated circuit having a ruthenium contact structure.

FIG. 18 illustrates a flow diagram of some embodiments of a method 1800 of forming an integrated chip having an interconnect structure with an intermixing barrier layer.

While method 1800 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1802, a transistor structure is formed and surrounded by a lower ILD layer. The transistor structure comprises a gate electrode formed over a substrate and a pair of source/drain regions disposed on opposite sides of the gate electrode. A sidewall spacer is formed alongside the gate electrode lining or covering sidewalls of the gate electrode. FIGS. 4-5 illustrate cross-sectional views 400-500 of some embodiments corresponding to act 1802.

At 1804, the gate electrode is recessed and a gate barrier layer is formed on the recessed upper surface of the gate electrode. In some embodiments, the gate barrier layer comprises or is made of fluorine-free tungsten (FFW). In some embodiments, a first contact etch stop layer is formed over the gate barrier layer filling a remaining upper portion of the sidewall spacer. FIGS. 6-8 illustrate cross-sectional views 600-800 of some embodiments corresponding to act 1804.

At 1806, a lower barrier layer and a lower conductive plug are formed through the lower ILD layer reaching on a source/drain region of the transistor structure within the substrate. FIGS. 9-10 illustrate cross-sectional views 900-1000 of some embodiments corresponding to act 1806.

At 1808, the lower conductive plug is recessed and a capping layer is formed to fill an upper portion of the lower barrier layer. In some embodiments, the capping layer may be formed by depositing selective tungsten followed by a CMP process. FIGS. 11-12 illustrate cross-sectional views 1100-1200 of some embodiments corresponding to act 1808.

At 1810, an upper ILD layer is formed over the lower ILD layer and the capping layer. FIG. 13 illustrates a cross-sectional view 1300 of some embodiments corresponding to act 1810.

At 1812, a plurality of openings is formed through the upper ILD layer and/or the first contact etch stop layer reaching on the gate barrier layer or the capping layer. FIGS. 14-15 illustrate cross-sectional views 1400-1500 of some embodiments corresponding to act 1812.

At 1814, the plurality of openings is filled with a metal material to form a plurality of conductive plugs. In some embodiments, the metal material is ruthenium. FIG. 16 illustrates a cross-sectional view 1600 of some embodiments corresponding to act 1814.

At 1816, an annealing process is performed such that a metal-dielectric intermixing barrier layer is formed at an interface of the plurality of conductive plugs and the upper ILD layer. The metal-dielectric intermixing barrier layer acts as a barrier and adhesive layer between the metal material of the plurality of conductive plugs and the dielectric material of the upper ILD layer. In some embodiments, the metal material is ruthenium. FIG. 17 illustrates a cross-sectional view 1700 of some embodiments corresponding to act 1816.

Therefore, the present disclosure relates to a new integrated circuit device that eliminates a glue or barrier layer between an interconnect feature and a surrounding ILD layer and a method of manufacturing such a device by using an annealing process to form a metal-dielectric intermixing barrier layer.

Accordingly, in some embodiments, the present disclosure relates to an integrated circuit device. A transistor structure includes a gate electrode separated from a substrate by a gate dielectric and a pair of source/drain regions disposed within the substrate on opposite sides of the gate electrode. A lower conductive plug is disposed through a lower inter-layer dielectric (ILD) layer and contacting a first source/drain region. A capping layer is disposed directly on the lower conductive plug. An upper inter-layer dielectric (ILD) layer is disposed over the capping layer and the lower ILD layer. An upper conductive plug is disposed through the upper ILD layer and directly on the capping layer.

In other embodiments, the present disclosure relates to an integrated circuit device. A lower inter-layer dielectric (ILD) layer is disposed over a substrate and has a lower plug opening vertically extending through the lower ILD layer. A lower barrier layer is disposed along sidewall surfaces of the lower plug opening and a lower conductive plug fills a lower portion of the lower plug opening. An upper ILD layer is disposed over the lower ILD layer and has an upper plug opening vertically extending through the upper ILD layer. An upper conductive plug fills the upper plug opening and comprises an intermixing barrier layer disposed along sidewall surfaces of the upper plug opening and a metal core filling remaining space of the upper plug opening.

In yet other embodiments, the present disclosure relates to a method of forming an integrated circuit device. The method comprises forming a lower inter-layer dielectric (ILD) layer over a substrate and forming a lower conductive plug through the lower ILD layer reaching on a source/drain region of a transistor structure within the substrate. The method further comprises forming a capping layer on the lower conductive plug and forming an upper ILD layer over the lower ILD layer and the capping layer. The method further comprises forming an upper conductive plug through the upper ILD layer reaching the capping layer. The upper conductive plug is formed by forming a core metal followed by a self-protecting annealing process to form an intermixing barrier layer lining an interface of the metal core and the upper ILD layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device, comprising:
a transistor structure including a pair of source/drain regions disposed on a substrate and a gate electrode between the pair of source/drain regions, the gate electrode being separated from the substrate by a gate dielectric;
a lower conductive plug disposed through a lower inter-layer dielectric (ILD) layer and contacting a first source/drain region;
a capping layer disposed directly on the lower conductive plug;
an upper inter-layer dielectric (ILD) layer disposed over the capping layer and the lower ILD layer;
an upper conductive plug disposed through the upper ILD layer and directly on the capping layer;
a lower barrier layer covering sidewalls of the capping layer and the lower conductive plug;
a first contact etch stop layer disposed between the upper ILD layer and the lower ILD layer; and
a power rail conductive plug, wherein the power rail conductive plug comprises a metal core and an intermixing barrier layer lining a sidewall of the metal core, wherein the metal core directly contacts the first contact etch stop layer.

2. The integrated circuit device of claim 1, wherein the capping layer comprises tungsten.

3. The integrated circuit device of claim 1, wherein the upper conductive plug comprises a metal core and an intermixing barrier layer lining an interface of the metal core and the upper ILD layer.

4. The integrated circuit device of claim 3, wherein the metal core comprises ruthenium; and wherein the intermixing barrier layer comprises ruthenium oxide.

5. The integrated circuit device of claim 4, wherein the intermixing barrier layer has a thickness in a range of from about 10 nm to about 15 nm.

6. The integrated circuit device of claim 1, wherein the lower conductive plug comprises cobalt.

7. The integrated circuit device of claim 1,
wherein the first contact etch stop layer has a top surface coplanar with that of the capping layer.

8. The integrated circuit device of claim 7,
wherein the power rail conductive plug comprises a first portion and a second portion, wherein the first portion is disposed through the first contact etch stop layer, wherein the second portion comprises a bottom surface disposed on the capping layer; and
wherein the intermixing barrier layer comprises an upper portion covering an interface of the metal core and the upper ILD layer.

9. The integrated circuit device of claim 8, further comprising
a second contact etch stop layer disposed between the upper ILD layer and the first contact etch stop layer;
wherein the intermixing barrier layer comprises a lower portion lining an interface of the metal core and the second contact etch stop layer.

10. The integrated circuit device of claim 9, wherein the upper portion and the lower portion of the intermixing barrier layer comprise different materials.

11. The integrated circuit device of claim 8, wherein the bottom surface of the second portion of the power rail conductive plug is below a bottommost surface of the first portion of the power rail conductive plug.

12. The integrated circuit device of claim 1, further comprising
a gate electrode plug contacting the gate electrode;
wherein the gate electrode plug comprises the same material as the upper conductive plug.

13. An integrated circuit device, comprising:
a lower inter-layer dielectric (ILD) layer disposed over a substrate;
a lower conductive plug disposed in the lower ILD layer;
a lower barrier layer disposed along sidewall surfaces of the lower conductive plug;
an upper ILD layer disposed over the lower ILD layer; and
an upper conductive plug disposed in the upper ILD layer and comprising a metal core and an intermixing barrier layer disposed along sidewall surfaces of the metal core;
wherein the intermixing barrier layer comprises atoms of the metal core and the upper ILD layer, and wherein a bottommost surface of the intermixing barrier layer overlies a topmost surface of the lower ILD layer.

14. The integrated circuit device of claim 13, further comprising:
a contact etch stop layer (CESL) disposed between the upper ILD layer and the lower ILD layer;
wherein the upper conductive plug extends through the contact etch stop layer, and wherein the intermixing barrier layer is absent from an interface of the metal core and the contact etch stop layer.

15. The integrated circuit device of claim 13, further comprising:
a tungsten capping layer disposed between and directly contacting the lower conductive plug and the upper conductive plug.

16. The integrated circuit device of claim 13, wherein a bottommost surface of the metal core is level with the bottommost surface of the intermixing barrier layer.

17. An integrated circuit device, comprising:
a lower inter-layer dielectric (ILD) layer disposed over a substrate;
a lower conductive plug disposed through the lower ILD layer reaching a source/drain region of a transistor structure;
a capping layer disposed on the lower conductive plug and having a topmost surface overlying the lower ILD layer;
an upper ILD layer disposed over the lower ILD layer and the capping layer; and
an upper conductive plug disposed through the upper ILD layer reaching the capping layer;
wherein the upper conductive plug comprises a metal core and an intermixing barrier layer lining an interface of the metal core and the upper ILD layer, and wherein the intermixing barrier layer comprises atoms of the metal core and the upper ILD layer, and wherein a bottommost surface of the intermixing barrier layer overlies a topmost surface of the lower ILD layer.

18. The integrated circuit device of claim 17, wherein the metal core is ruthenium and the intermixing barrier layer contains ruthenium and oxygen.

19. The integrated circuit device of claim 17, wherein the metal core is deposited at a temperature in a range of from about 120° C. to about 260° C.

20. The integrated circuit device of claim 17, wherein the intermixing barrier layer is formed by performing an annealing process at a temperature in a range of from about 490° C. to about 550° C.

* * * * *